United States Patent
Rytkönen

(10) Patent No.: US 10,024,881 B2
(45) Date of Patent: Jul. 17, 2018

(54) MEMS SENSOR

(71) Applicant: MURATA MANUFACTURING CO., LTD., Nagaokakyo-shi (JP)

(72) Inventor: Ville-Pekka Rytkönen, Klaukkala (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 200 days.

(21) Appl. No.: 15/192,192

(22) Filed: Jun. 24, 2016

(65) Prior Publication Data

US 2016/0377649 A1 Dec. 29, 2016

(30) Foreign Application Priority Data

Jun. 26, 2015 (FI) ...................................... 20155508

(51) Int. Cl.
*G01P 15/125* (2006.01)
*G01P 15/18* (2013.01)
(Continued)

(52) U.S. Cl.
CPC .............. *G01P 15/125* (2013.01); *G01C 9/06* (2013.01); *G01P 15/18* (2013.01);
(Continued)

(58) Field of Classification Search
CPC ................... G01P 15/125; G01P 15/18; G01P 2015/0817; G01C 9/06; G01C 2009/062; B81B 2201/0235
See application file for complete search history.

(56) References Cited

U.S. PATENT DOCUMENTS

| 7,322,242 B2 | 1/2008 | Merassi et al. |
| 2006/0032310 A1* | 2/2006 | Merassi ................ B81B 7/0048 |
| | | 73/514.35 |

(Continued)

FOREIGN PATENT DOCUMENTS

| EP | 0 981 052 A2 | 2/2000 |
| EP | 2 105 707 A2 | 9/2009 |

(Continued)

OTHER PUBLICATIONS

International Search Report application No. PCT/IB2016/053695 dated Sep. 7, 2016.

(Continued)

*Primary Examiner* — David Bolduc
(74) *Attorney, Agent, or Firm* — Squire Patton Boggs (US) LLP

(57) ABSTRACT

The present invention relates to A MEMS sensor with movable and fixed components for measuring linear acceleration. The MEMS sensor includes at least two mutually independent differential sensor elements disposed inside a common frame structure providing walls for hermetic sealing of the MEMS sensor. The mutually independent differential sensor elements are pairwise configured to perform double differential detection of linear acceleration. The MEMS sensor includes a common anchoring area to which the at least two differential sensor elements are anchored. The common anchoring area is located at the centroid of the pairwise configured differential sensor elements. A self-test capability of the MEMS sensor is also provided.

18 Claims, 10 Drawing Sheets

(51) Int. Cl.
*G01C 9/06* (2006.01)
*G01P 15/08* (2006.01)

(52) U.S. Cl.
CPC .......................... *B81B 2201/0235* (2013.01); *G01C 2009/062* (2013.01); *G01P 2015/0817* (2013.01)

(56) References Cited

U.S. PATENT DOCUMENTS

| | | | |
|---|---|---|---|
| 2007/0245826 A1* | 10/2007 | Cardarelli | G01C 19/5719 73/504.12 |
| 2009/0145225 A1 | 6/2009 | Nasiri et al. | |
| 2009/0183570 A1 | 7/2009 | Acar et al. | |
| 2009/0241662 A1* | 10/2009 | Supino | G01C 19/5719 73/504.12 |
| 2010/0107762 A1 | 5/2010 | Classen et al. | |
| 2012/0125104 A1 | 5/2012 | Qiu et al. | |
| 2013/0192362 A1* | 8/2013 | Rytkonen | G01P 15/08 73/504.08 |
| 2013/0192371 A1* | 8/2013 | Rytkonen | G01P 15/02 73/514.32 |
| 2014/0251011 A1* | 9/2014 | Zhang | G01P 15/08 73/514.32 |

FOREIGN PATENT DOCUMENTS

| | | |
|---|---|---|
| EP | 2 775 309 A1 | 9/2014 |
| WO | 2013/104827 A1 | 7/2013 |

OTHER PUBLICATIONS

Search Report for corresponding Finnish Patent Application No. 20155508, dated Mar. 24, 2016.

* cited by examiner

MEMS SENSOR

BACKGROUND

Field

The present invention relates to MEMS sensors and especially to MEMS sensors for measuring linear acceleration as defined in independent claim 1.

Description of the Related Art

Micro-Electro-Mechanical Systems, or MEMS can be defined as miniaturized mechanical and electro-mechanical systems where at least some sensor elements have a mechanical functionality. MEMS structures can be applied to quickly and accurately detect very small changes in physical properties.

MEMS devices convert a measured mechanical signal into an electrical signal. MEMS sensors measure the mechanical phenomenon and the electronics then process the information derived from the sensors and through some decision making capability direct the actuators to respond by e.g. moving, positioning, or regulating in order to thereby control the environment for some desired outcome or purpose. MEMS devices might be capacitive or make use of piezoelectric transduction.

In an inertial sensor employing a MEMS-type accelerometer, structures like rotor masses, cantilevered beams and/or interdigitated comb fingers can be used to sense displacement of these structures.

The two major components of a MEMS accelerometer are the rotor mass and the sensing electrode pairs. The rotor mass and the sensing electrode pairs are anchored to a substrate. Since the rotor mass is suspended over a recess on the substrate with springs, it is free to move in response to an external acceleration. When external forces are applied to the accelerometer, the rotor mass moves against the forced direction due to an inertial force. The movement causes capacitance variations between interdigitated comb fingers which form pairs of parallel plate capacitors.

In a capacitive MEMS accelerometer, a variable capacitor is formed between a stationary electrode and a movable electrode attached to a suspended inertial rotor mass.

Acceleration sensors sense the acceleration force and detect the movement of the inertial rotor mass displacing itself elastically under the effect of acceleration and thereby also the movable electrode deflects in response to the acceleration in an accelerometer. The change in capacitance, which directly shows as a change in distance (or gap) between the comb finger electrodes is related to the displacement of the rotor mass.

The deflection is sensed by associated electronics and converted to an electrical signal, which is then delivered by the electronics to an external computer. The computer processes the sensed data to calculate the property being measured.

An accelerometer is a device that measures proper acceleration, a.k.a. the g-force. Proper acceleration is the physical acceleration experienced by an object, and it's measured relative to an inertial observer (an inertial frame), who is momentarily at rest relative to the object being measured. For example, an accelerometer at rest relative to Earth's surface will indicate about 1 g acceleration upwards. In order to obtain the acceleration due to motion with respect to the Earth, gravity offset shall be subtracted from the readings, and corrections are needed for effects caused by the Earth's rotation relative to the inertial frame. A multi-axis accelerometer detects magnitude and direction of the proper acceleration as vector quantity, and it may be used to sense for example orientation, coordinate acceleration, vibration, shock and falling in a resistive medium.

2-axis accelerometers measure acceleration in two directions and 3-5 axis accelerometers measure acceleration in three directions. There are also 1-axis accelerometers that measure acceleration in one direction.

The measurement range of an accelerometer is the level of acceleration supported by the sensor's output signal specifications, typically specified in ±g. This is the greatest amount of acceleration the part can measure and accurately represent as an output. An inclinometer is an instrument for measuring angles of slope, elevation or depression of an object with respect to gravity. An accelerometer, such as a MEMS accelerometer, may be used as a sensor for an inclinometer, when suitable calculation is provided for converting the detected acceleration values into angle values. The axes of measurement of an inclinometer are typically, but not necessarily, orthogonal.

A tilt sensor or a tilt meter is an instrument measuring tilt, often with respect to a plane defined by two axes. A typical tiltmeter is designed for measuring changes from the vertical level. Full motion tilt sensor may use at least three axes. An accelerometer capable of measuring acceleration may be used as a sensor for a tiltmeter, when suitable calculation is provided for converting the detected acceleration values into resultant vector angle values. An accelerometer may measure tilt with respect to one, two or three axes. The axes of measurement of a tiltmeter are typically, but not necessarily, orthogonal.

We will use a common term inclinometer for any device capable of measuring inclination or tilt.

Depending on purpose of use, inclinometer offset stability requirements may be stringent, requiring mechanically very stable MEMS accelerometer sensor elements. Anchoring, in other words suspension of the accelerometer sensor elements on an anchor structure in the substrate is a key factor for stability of MEMS sensor elements. In order to ensure that any mechanical stress through the package of a MEMS sensor element causes minimal errors, a well-known method is to place stator and rotor anchor structures near to each other. If mechanical stress occurs, it will deform stator and rotor similarly, which compensates offset caused by such deforming. Offset stability can also be improved by using multiple detection cells in each dimension in order to enable double differential self-compensation. However, if anchors of individual sensor elements are far from each other, self-compensation is not perfect.

U.S. Pat. No. 7,322,242 presents a micromechanical structure with a centroidal rotor-anchoring region coupling a single, frame-like rotor and four stator structures arranged with stator-anchoring regions near the rotor anchoring region. The problem relating to this prior art is that although use of a single rotor enables differential detection, the device may also be subject to common mode errors that are not detectable with such single rotor mass solution. An improved MEMS sensor design is needed that enables double differential detection, which also enables canceling of common mode errors.

SUMMARY

An object of the present invention is to provide a MEMS sensor so as to overcome the prior art disadvantages.

Embodiments of the present invention are based on the idea of anchoring more than one independent differential sensor elements of a MEMS sensor in a relatively small common anchoring area, so that the independent sensor elements experience approximately similar mechanical stress through the package of the MEMS sensor. This arrangement has an advantage that the amount of errors caused by mechanical stress is minimized. In addition, the independent sensor elements may be arranged in pairs of sensor elements, allowing double differential detection of movement. This brings further advantage by allowing, for example, removal of common mode errors, and enables self-testing of the MEMS sensor for ensuring correct operation of the device even in safety critical applications.

According to a first aspect, A MEMS sensor with movable and fixed components for measuring linear acceleration is provided. The sensor can include at least two mutually independent differential sensor elements disposed inside a common frame structure. The frame structure provides walls for hermetic sealing of the MEMS sensor. The at least two mutually independent differential sensor elements are pairwise configured to perform double differential detection of the linear acceleration. The MEMS sensor comprises a common anchoring area to which rotor masses and stator structures of the pairwise configured differential sensor elements are anchored. The common anchoring area is located at the centroid of the pairwise configured differential sensor elements.

According to a second aspect, each differential sensor element of the at least two pairwise configured mutually independent sensor elements includes a movable rotor mass suspended with a spring to an anchor structure within the common anchoring area. The spring allows the rotor mass to move within a plane of the device. Two immovable stator structures are rigidly anchored to one or more anchor structures within the common anchoring area. Two sensing electrode pairs each formed by a defined number of rotor fingers of the rotor mass and a defined number of stator fingers of one of the two stator structures are configured to provide a differential detection signal.

According to a third aspect, the two immovable stator structures of each differential sensor element of the at least two pairwise configured mutually independent sensor elements are disposed symmetrically in the plane of the device on opposite sides of the spring suspending the movable rotor mass.

According to a fourth aspect, the rotor masses of the differential sensor elements of the at least two pairwise configured mutually independent differential sensor elements are suspended to a common rotor anchor structure located at or in a vicinity of the centroid of the pairwise configured sensor elements within the common anchoring area.

According to a fifth aspect, rotor masses of the differential sensor elements of the pairwise configured mutually independent differential sensor elements are suspended to separate rotor anchor structures located at or in a vicinity of the centroid of the pairwise configured differential sensor elements within the common anchoring area.

According to a sixth aspect, stator structures of the differential sensor elements of the pairwise configured mutually independent differential sensor elements are anchored to a common stator anchor structure located at or in a vicinity of the centroid of the pairwise configured differential sensor elements within the common anchoring area.

According to a seventh aspect, stator structures of the differential sensor elements of the pairwise configured mutually independent differential sensor elements are anchored to a number of stator anchor structures located in a vicinity of the centroid of the pairwise configured differential sensor elements within the common anchoring area.

According to an eighth aspect, the rotor mass of each of the differential sensor elements of the pairwise configured mutually independent differential sensor elements is suspended to an anchor structure within the common anchoring area with a rectilinear beam spring allowing the rotor mass to move within the plane of the device, but preventing the rotor mass from moving away from the plane of the device. The spring defines a suspension axis of the sensor element, the suspension axis traversing along the longitudinal dimension of the spring.

According to a ninth aspect, the spring suspending the rotor mass of the respective sensor element is configured to act as a rotor electrode finger for both sensing electrode pairs of the respective sensor element.

According to a tenth aspect, the sensor comprises two pairs of differential sensor elements each pair having a common suspension axis oblique to the detection axes of the sensor elements. The suspension axes are mutually orthogonal, and each differential sensor element of the pairwise configured mutually independent differential sensor elements is configured to have two mutually orthogonal detection axes.

According to an eleventh aspect, the suspension axis of each differential sensor element has a 45 degree angle with respect to both said detection axes.

According to a twelfth sensor includes two pairs of differential sensor elements each pair having a common suspension axis orthogonal to a detection axis of both sensor elements in the respective pair of sensor elements. The suspension axes are mutually orthogonal, and each of the differential sensor elements is configured to have a single detection axis.

According to a thirteenth aspect, the sensor comprises one pair of differential sensor elements having a common suspension axis orthogonal to the detection axis of the pair of sensor elements, and each of the differential sensor elements is configured to have a single detection axis.

According to a fourteenth aspect, the sensing electrode pairs of the differential sensor elements of the pairwise configured mutually independent differential sensor elements are configured in mirrored positions with respect to a symmetry axis orthogonal to the common suspension axis of the respective sensor element pair. Each of such mirror symmetrical sensor element pairs produce a capacitive detection value that changes in mutually same direction.

According to a fifteenth aspect, the sensing electrode pairs of the differential sensor elements of the pairwise configured mutually independent differential sensor elements are configured pairwise symmetrically on opposite sides of the geometrical center of the pairwise configured mutually independent differential sensor elements. Each of such sensing electrode pairs on opposite sides of the geometrical center provide a capacitive detection value that changes in mutually same direction.

According to a sixteenth aspect, detection values of the differential sensor elements of the pairwise configured mutually independent differential sensor elements may be used for performing a self-test. The self-test includes summing the detection values of all differential sensor elements in a calculation unit, and the self-test indicates that the sensor is working correctly if the total sum of the self-test detection values equals zero.

According to a seventeenth aspect, any lateral dimension of the common anchoring area in the plane of the device does not exceed 20% of the total lateral dimension of the MEMS sensor in the same direction.

According to an eighteenth aspect, any lateral dimension of the common anchoring area in the plane of the device does not exceed 20% of the total lateral dimension of the pairwise configured mutually independent differential sensor elements in the same direction.

BRIEF DESCRIPTION OF THE DRAWINGS

In the following the invention will be described in greater detail, in connection with preferred embodiments, with reference to the attached drawings, in which.

DETAILED DESCRIPTION

The term suspension axis refers to the longitudinal direction of a spring suspending a rotor mass (a.k.a. rotor structure) to an anchor structure.

The plane of the device refers to the plane of the functional, movable structures of the MEMS device when in rest, i.e. not displaced due to external forces from an initial equilibrium position. In the following drawings and description, the plane of the device comprises an xy-plane. Dimensions of the functional structures of the MEMS device along this plane of the device may be referred to as lateral dimensions.

Anchor structure refers to a structure anchoring functional structures of a sensor element and/or the MEMS sensor to a substrate. An anchor is a three-dimensional structure extending both horizontally in the plane of the device, and also vertically. Reference to a location of an anchor structure at a specific point, for example a centroid of a structure, indicates that the specified point coincides with projection of the anchor structure in the plane of the device. When a functional structure is anchored to an anchor, suspension of the functional structure may be flexible or rigid depending on the intended functionality of the structure. When a functional structure is intended to be movable, suspension is preferably flexible at least in one dimension. An example of such movable structure is a rotor. When a functional structure is intended to be stable and fixed into one place, the suspension is preferably rigid, not allowing movement of the functional structure. In such case, we may say that the functional structure is rigidly anchored. An example of such stable and fixed functional structure is a stator.

The term detection axis refers to a linear axis along which a sensor device, sensor element or a capacitive electrode pair is capable of detecting displacement of a movable (rotor) structure with respect to a fixed (stator) structure, returning a detection value indicating both the direction and amount of displacement. Direction of a detection axis is different from the direction of the respective suspension axis of the device, element or electrode pair.

Differential detection refers to electrical detection of a displacement of a single movable (rotor) element by two capacitive electrode pairs having opposite direction of change of capacitance.

In following embodiments, a simplified MEMS sensor is used as an example. In a practical MEMS device, the sensor may comprise further sensor elements.

Figure 1:
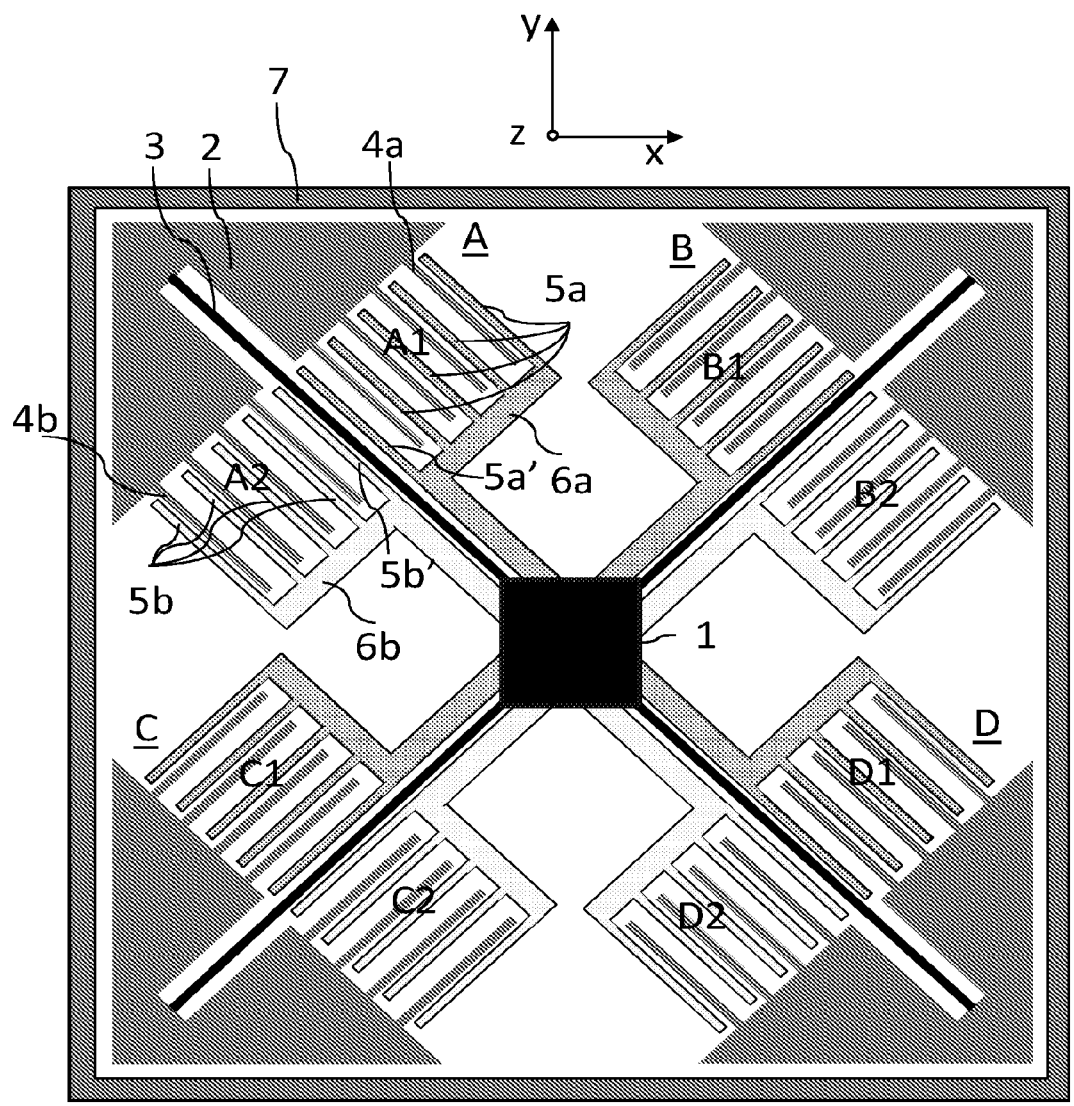
FIG. 1 presents a first embodiment of a MEMS sensor with four differential sensor elements having oblique suspension axes with respect to the intended detection axes.

FIG. 1 presents a first embodiment of a two-axis MEMS sensor with four differential sensor elements (A, B, C, D) each having an oblique suspension axis with respect to the intended detection axes. As defined above, with suspension axis we refer to the longitudinal direction of the spring (3) suspending the movable rotor mass (2) to an anchoring area (1). Detection axes are intended to be in x- and y-axis direction. In this example, rotor masses (2) of all four differential sensor elements (A, B, C, D) have been suspended to a common anchoring area (1) located approximately in the geometrical center (centroid) of the MEMS sensor, this way ensuring that in case any mechanical stress from package would exist, all four sensor elements (A, B, C, D) would be subject to similar stress, which may thus be compensated utilizing differential detection provided by the sensor elements (A, B, C, D). The common anchoring area (1) is a relatively small area within the total area of the MEMS sensor in xy-plane, and preferably located at the geometrical center (centroid) of the MEMS sensor. As defined above, placement location at the geometrical center (centroid) indicates that the geometrical center of the MEMS sensor resides within the area of the common anchoring area (1). The lateral dimensions of the common anchoring area (1) are small compared to lateral dimensions of the MEMS sensor. Any maximum lateral dimension of the common anchoring area (in xy-plane) is preferably less than one fifth (20%) of the total lateral dimension of the MEMS sensor in the respective direction. Actual shape of the common anchoring area (1) may be any suitable shape. One or more anchor structures may be located within the common anchoring area (1) as will be described later. When we refer to a location that is within the common anchoring area (1), lateral dimensions of the location area are delimited to the size of the common anchoring area (1) as described above. There may be one or several anchor structures within the common anchoring area (1). In case more than one anchor structure is used, the distance between rotor anchor structures and stator anchor structures is small compared to lateral dimensions of the MEMS sensor. The term "in vicinity" in relation to a location of an anchor structure also refers to that the anchor structure is within the delimited common anchoring area (1), although not necessarily at the very center (centroid) of this area. Rotor and stator anchor structures can also be disposed close to each other by using approximately minimum distance obtainable with the current manufacturing process. Preferably, anchor structures within this common anchoring area are not separated by any moving structures of the sensors. In other words, no moving parts of the sensors are located within the common anchoring area, and especially not between anchor structures disposed within the common anchoring area. Thus, the common anchoring area may also be called as an integral anchoring area, which only comprises anchor structures and gaps configured to separate the anchors from each other electrically and mechanically.

Each sensor element (A, B, C, D) includes a rotor mass (2) suspended to an anchor structure within the common anchoring area (1) by a spring (3). Preferably, the rotor masses (2) and the springs (3) of each sensor element are essentially similar, although arranged in different orientation. The spring (3) is preferably made flexible so that the rotor mass (2) may move within the xy-plane, which may be called as the plane of the MEMS sensor or as the plane of the device, but stiff in z-axis direction, in other words out of the plane of the device. This kind of spring (3) may be formed as a long, straight beam that has a narrow cross-section in xy-plane, but is relatively thick in z-axis dimension. Added thickness increases spring factor in the respective dimension, preventing movement of the rotor mass (2) in this direction, in this case in z-axis direction. It may be understood that while this suspending spring (3) is coupled to an anchoring point within the common anchoring area (1), the actual movement path of the rotor mass (2) could be considered being on a circle around this point of coupling. When the spring (3) is long, the radius of this circle is large, and small displacements in x- or y-direction may be considered essentially as linear displacement. In addition to turning around the coupling point, the long spring (3) may also bend. A number of rotor comb fingers (4a, 4b) are attached to the rotor mass (2). Rotor comb fingers (4a, 4b) form the movable electrodes for detecting the motion of the rotor mass (2). In order to implement a differential sensor element (A, B, C, D), the non-movable electrodes are formed by a number of immovable stator fingers (5a, 5b) attached to two separate stator structures (6a, 6b). These stator structures (6a, 6b) are rigidly coupled to anchor structure(s) within the common anchoring area (1) so that they can be considered as fixed structures. While both the rotor mass (2) and the two stators (6a, 6b) are rigidly anchored to the substrate with a common anchor structure or anchor structures located very close to each other, within the same common anchoring area (1), any mechanical stress caused by the package will affect these parts in a similar way, so that effects of such stress can be compensated in order to improve accuracy of detection.

Rotor comb fingers (4a) and first stator fingers (5a) form a first sensing electrode pair (A1), and rotor comb fingers (4b) and second stator fingers (5b) form a second sensing electrode pair (A2). In addition, in this embodiment, the spring (3) may be used as an additional rotor electrode finger, increasing the signal received from both the first sensing electrode pair and the second sensing electrode pair. This is enabled by having further stator fingers (5a', 5b') arranged next to the spring (3). Rotor comb fingers and stator comb fingers in each sensor element (A, B, C, D) form two like differential sensing electrode pairs (A1, A2; B1, B2; C1, C2; D1, D2).

Physical placement and electrical functional arrangement of the sensing electrode pairs (A1, A2; B1, B2; C1, C2; D1, D2) may be characterized in that the sensor elements (A, C; B, D) and at the same time the sensing electrode pairs are pairwise mirror images of each other: the sensor element D and its sensing electrode pair (D1, D2) is a mirror image of the sensor element A and its sensing electrode pairs (A1, A2), with the mirror considered to be disposed along the oblique suspension axis corresponding to the longitudinal direction of springs (3) of sensor elements B and C, in other words, the symmetry axis is orthogonal to the suspension axis of the respective sensor elements. In similar manner, the sensor element C and its sensing electrode pair is a mirror image of the sensor element B and its sensing electrode pair (B1, B2), if a mirror is considered to be disposed along the oblique suspension axis corresponding to the longitudinal direction of springs (3) of sensor elements A and D; in other words, the symmetry axis is orthogonal to the suspension axis of the respective sensor elements. This paired mirror image symmetry applies even to the electrical functionality of the sensing electrode pairs: direction of change of capacitance of each mirrored sensing electrode pair (A1, D1; A2, D2; B1, C1; B2, C2) is always the same. Such pairwise arrangement of the sensor elements causes the number of sensor elements in the device preferably to be an even number.

All four springs (3) are preferably arranged to have a 45° (45 degree) angle with respect to both a symmetry axis of the MEMS sensor in x-axis direction and a symmetry axis of the MEMS sensor in y-axis direction. In other words, each of the sensor elements (A, B, C, D) have an oblique suspension axis of the movable (rotor) element when compared to the detected directions of motion. Preferably, the suspension axes in this embodiment have a 45° angle with respect to the preferably orthogonal directions of acceleration/inclination to be detected, i.e. the detection axes. In a practical device, some deviation of the suspension axis angle is possible without deviating from the scope, so that the angle between the suspension axis angle and the detection axes may vary between 40° and 50°. As sensor dies are typically rectangular, sensor axes may also be said to have an oblique or a 45° angle with respect to the edges of the die.

As indicated above, the MEMS sensor includes four sensor elements (A, B, C, D) having their common anchoring area (1) disposed at the common geometrical center (centroid) of the entire MEMS sensor in order to enable compensation of stress caused by the package. In another embodiment, the four sensor elements (A, B, C, D) are disposed within the enclosure of the frame so that the centroid of the four sensor elements (A, B, C, D) does not coincide the centroid of the entire MEMS sensor element. In such case, a common anchoring area (1) of the symmetrically arranged four sensor elements (A, B, C, D) disposed at the common geometrical center (centroid) of the four sensor elements (A, B, C, D) provides similar benefits for the performance of the four mechanically independent but functionally pairwise coupled sensor elements.

Figure 10A:
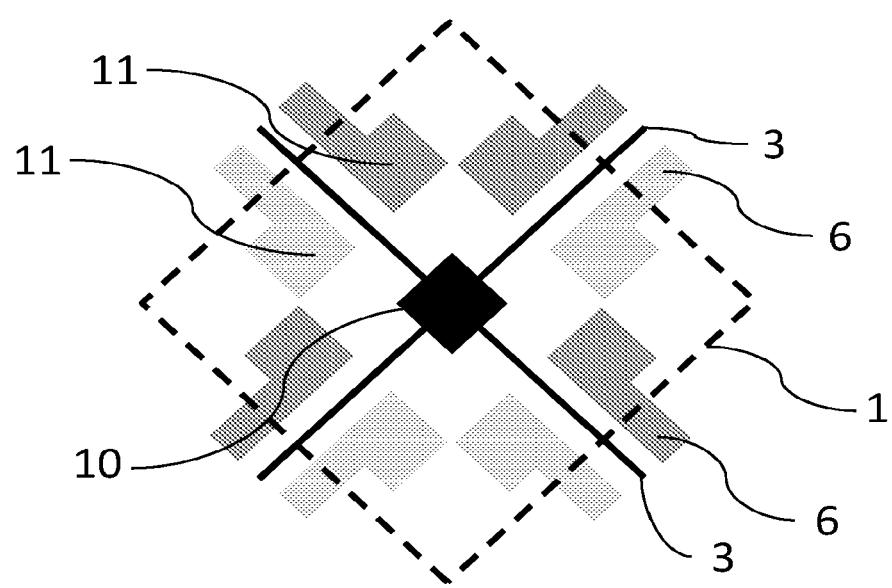
FIGS. 10a and 10b illustrate two exemplary anchor structure arrangements within a common anchoring area.
Figure 10B:
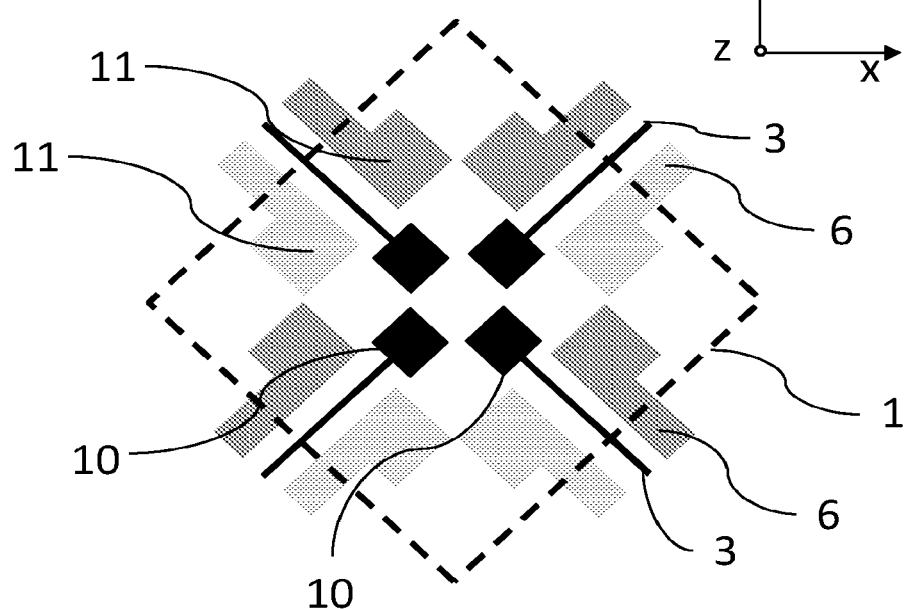

FIGS. 10a and 10b illustrate two exemplary anchor structure arrangements within the common anchoring area (1) of a MEMS sensor described in FIG. 1. In an embodiment illustrated in FIG. 10a, the springs (3) are all anchored to a single, common rotor anchor structure (10) disposed at or in the vicinity of the geometrical center (centroid) of the MEMS sensor within the common anchoring area (1), and each of the stator structures (6) have their own stator anchor structures (11) disposed in the vicinity of the geometrical center (centroid) of the MEMS sensor within the common anchoring area (1) and thus also in the vicinity of the common rotor anchor structure (10) In the embodiment illustrated in FIG. 10b, each of the rotor springs have their own rotor anchor structures (10) within the common anchoring area (1) in the vicinity of the geometrical centroid of the MEMS sensor, and each of the stator structures have their own stator anchor structures (11) within the common anchoring area (1). In a further embodiment, not shown in the figures, some or all of the stator structures (6) may share a common stator anchor structure. In a yet further embodiment, at least some of the rotor suspending springs (3) have their own rotor anchor structures disposed in the vicinity the geometrical center of the MEMS sensor within the common anchoring area (1), while other rotors may share an anchor structure within the common anchoring area (1). In yet another embodiment, a single, common anchor structure is arranged at the common anchoring area, which is common to all stator structures and all springs suspending rotor masses of the multiple sensor elements, which may be illustrated in FIG. 1, for example, if the common anchoring area (1) is considered as a single, common anchor structure.

Now returning back to FIG. 1, it may be noted that except for the possibly shared anchor structures within the common anchoring area (1), the four sensor elements (A, B, C, D) are independent of each other, in particular, the rotor masses (2) are not coupled to each other, but move independently. A frame structure (7) surrounds the group of four sensor elements (A, B, C, D), which are disposed in an enclosure formed by the frame structure (7). Purpose of the frame structure (7) is to provide walls for hermetic sealing of the movable parts (stators, rotor masses) of the MEMS sensor. The MEMS sensor element is suspended on a substrate, and a cap may be added to the structure in order to complete the sealing.

Figure 2:
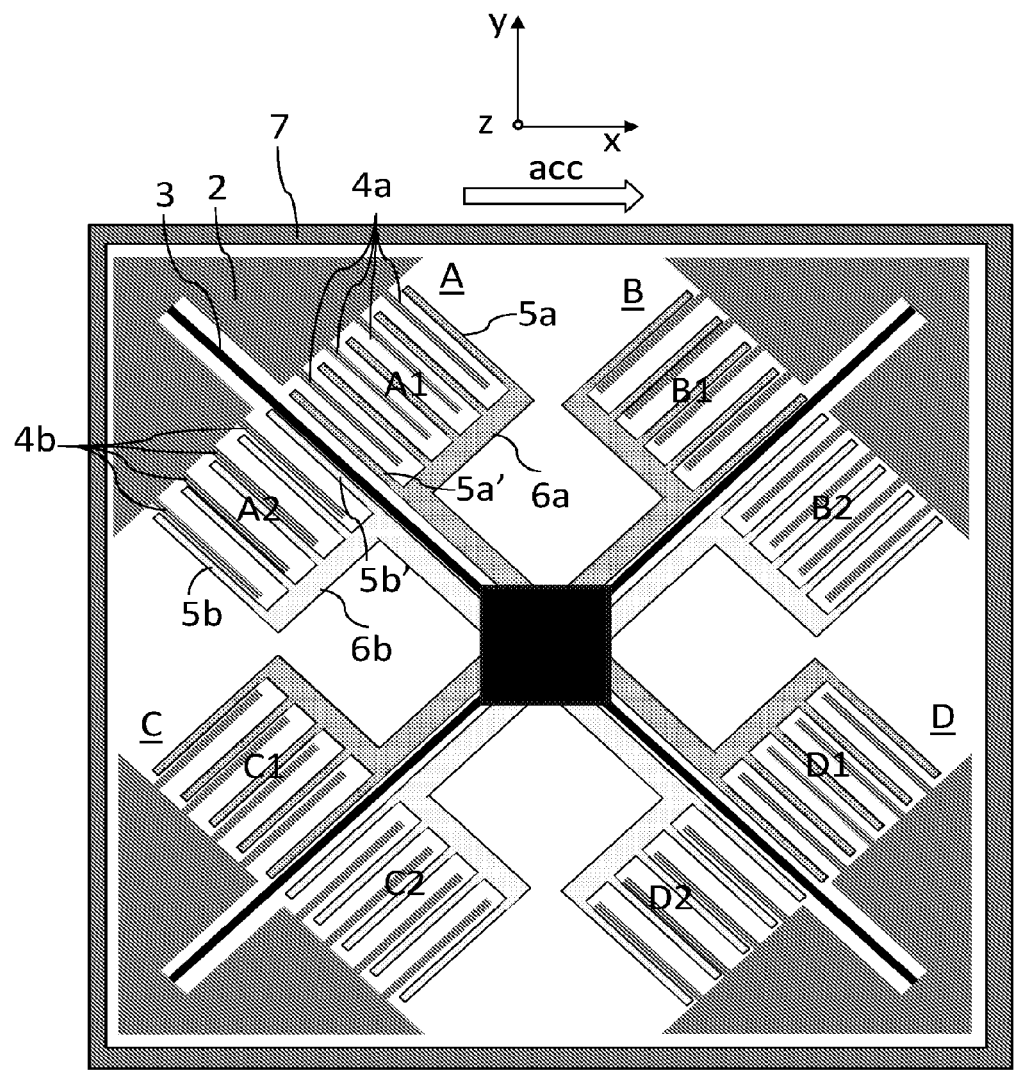
FIG. 2 shows the sensor element of FIG. 1 when subject to acceleration in the negative x-axis direction.

FIG. 2 shows the sensor element of FIG. 1 when subject to acceleration in the positive x-axis direction. This is indicated by the block arrow (acc) pointing towards left. It may be seen that each rotor mass (2) has now moved towards the negative x-axis direction due to inertia of the rotor mass (2). Let's first focus to sensor element A and its two sensing electrode pairs (A1, A2). When the rotor mass (2) of sensor element A moves towards negative x-axis, its rotor fingers (4a) move away from the stator fingers (5a) of the first stator (6a) and its rotor fingers (4b) move closer to the stator fingers (5b) of the second stator (6b). Thus, detected capacitance in the first sensing electrode pair (A1) will decrease and the detected capacitance in the second sensing electrode pair (A2) will increase. It can further be noticed that the spring (3) has moved away from the stator finger (5a') of the first stator next to it, and moved closer to the stator finger (5b') of the second stator next to it. This way, the spring (3) appears as an additional, common rotor finger for both stators (6a, 6b), increasing the signal strength received from the sensing electrode pairs (A1, A2).

Let's mark detected capacitance of the first sensing electrode pair (A1) of the sensor element A with $C_{A1}$, and the capacitance of the second sensing electrode pair (A2) of the sensor element A with $C_{A2}$. The differential output of the first sensor element may be calculated as $C_{A1}-C_{A2}$. Combining in similar manner differential outputs of all four sensor elements in the MEMS sensor, the total detected capacitance given by the MEMS sensor with four sensor elements may be calculated from the four different differential outputs.

The differential output along x- and y-axes may be calculated for example as:

$$C(x)=-(C_{A1}-C_{A2})+(C_{B1}-C_{B2})+(C_{C1}-C_{C2})-(C_{D1}-C_{D2})$$

$$C(y)=-(C_{A1}-C_{A2})-(C_{B1}-C_{B2})-(C_{C1}-C_{C2})-(C_{D1}-C_{D2})$$

wherein each of the sensor elements (A, B, C, D) provides a differential detection result, C(x) presents the obtained total differential capacitance value corresponding to the acceleration component in x-axis direction and C(y) presents the obtained total differential capacitance value corresponding to the acceleration component in y-axis direction. With suitable processing, the direction of a detected acceleration in any direction in the xy-plane may be calculated from these values, and the amount of acceleration is received as a numeric value. In case of the exemplary movement in negative x-axis direction, total change of capacitance of sensor elements A and D would show a negative value, whereas sensor elements B and C would return a positive value. If the acceleration occurred in negative x-axis direction, causing the rotor elements to move towards the positive x-axis direction, sensor elements A and D would show a positive value, whereas sensor elements B and C would return a negative value. Change of the capacitance may also be detected for each sensing electrode pair (A1, A2, B1, B2, C1, C2, D1, D2) separately. If all rotor masses (2) moved towards negative x-axis, sensing electrode pairs A2, B1, C1 and D2 will show an increase in the capacitance due to the electrode fingers (4b, 5b) moving closer to each other, whereas sensing electrode pairs A1, B2, C2 and D1 would show a decrease in the capacitance due to the respective electrode fingers (4a, 5a) moving away from each other. In another example, if the rotor masses (2) moved towards the positive y-axis for instance due to acceleration in negative y-axis direction, sensing electrode pairs A1, B1, C1 and D1 will detect an increase of capacitance, whereas sensing electrode pairs A2, B2, C2 and D2 will detect a decrease of capacitance. It may be noticed that the combination of increasing and decreasing capacitance values from different sensing electrode pairs is always unique to the direction of the movement, and thus the direction of the movement may be detected although a change of capacitance value is detected in each sensing electrode pair (A1, A2, B1, B2, C1, C2, D1, D2) whenever the rotor masses (2) move away from their equilibrium position in direction of either of the two detection axes. Having more than one pair of differential detection electrodes, double differential detection is enabled.

The fourfold symmetric, double differential arrangement provides also capability for self-testing. By summing the four differential outputs as:

$$C(\text{self test})=(C_{A1}-C_{A2})+(C_{B1}-C_{B2})+(C_{C1}-C_{C2})+(C_{D2}-C_{D2}),$$

a zero output should be received under any acceleration, except if the sensor element did not work correctly. If for example any mass, spring or electrical bonding of a mass in the MEMS sensor would be broken, the result of summing the self-test detection values as described above would not equal zero. This feature is especially valuable in safety critical applications, as it's easy to detect and ensure that the MEMS sensor element is functioning correctly.

Figure 3:
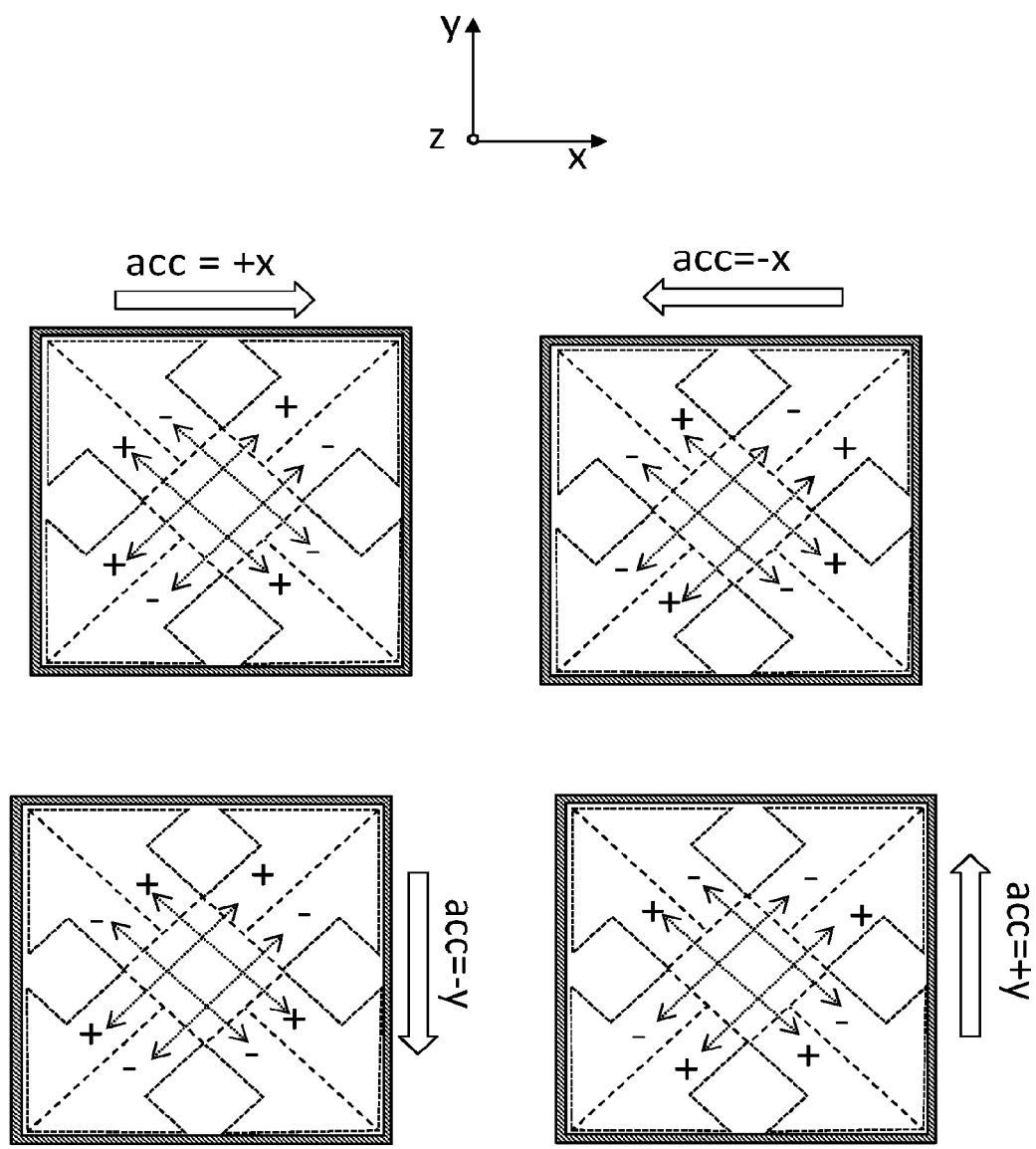
FIG. 3 illustrates electrical functional symmetry of the first embodiment of a MEMS sensor with oblique suspension axes.

It may be noticed that the sensing electrode pairs in the first embodiment have a symmetric pattern. Symmetry of the electrical functionality of the first embodiment of a two-axis MEMS sensor is illustrated in FIG. 3. Outline of the MEMS sensor is illustrated without details. Four different situations are shown, each representing acceleration in different directions: positive and negative x-axis and positive and negative y-axis. Direction of detected change of capacitance is marked with "+" and "−"-signs: if capacitance increases, a plus (+) is marked, and if capacitance decreases a minus (−) sign is marked. It may be noticed that in this embodiment, the direction of detected change is always mirror symmetrical with respect to two diagonal symmetry lines. Dotted arrows pairwise crossing each other orthogonally illustrate this symmetry. Each combination of directions of change among the four differential sensor elements are unique, enabling detection of any direction of acceleration in the plane defined by the x- and y-axes.

Figure 4:
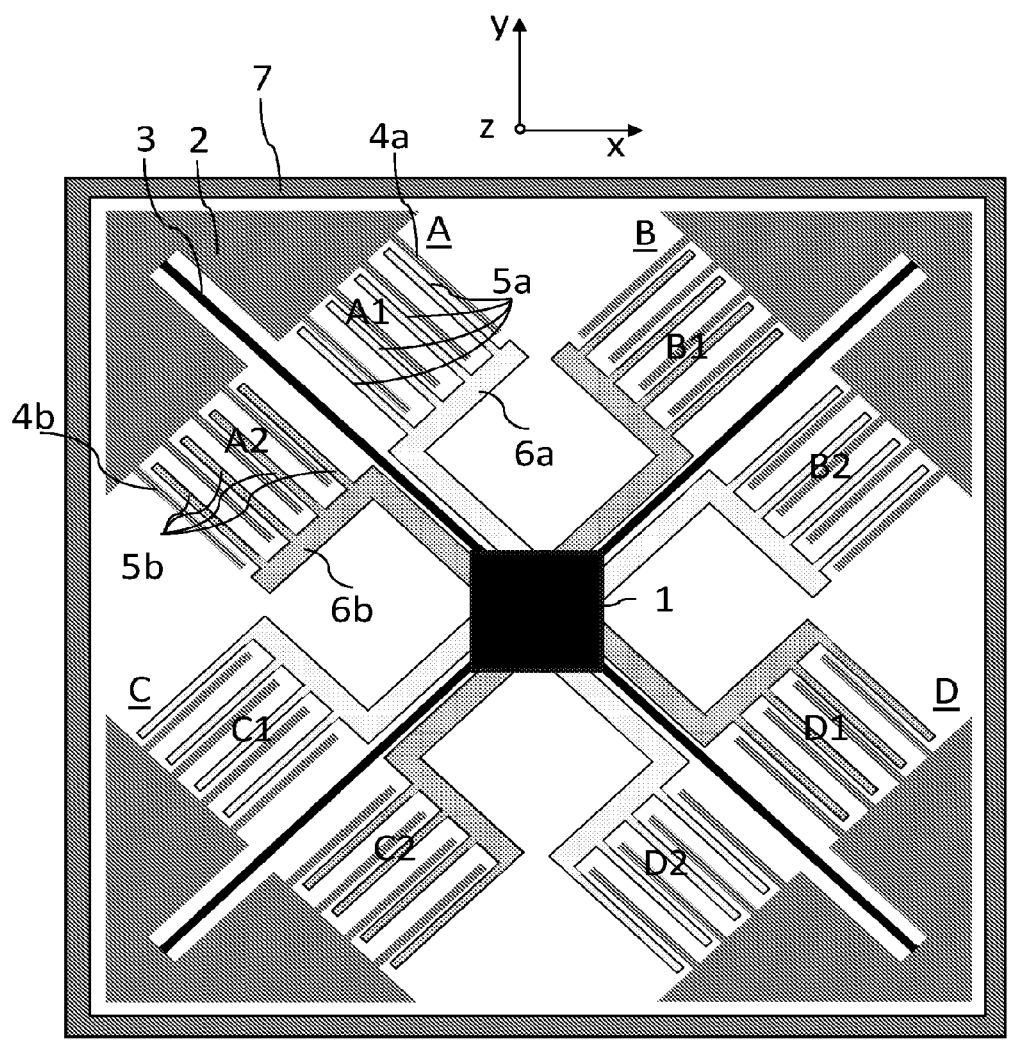
FIG. 4 presents a second embodiment of a MEMS sensor with four differential sensor elements having oblique suspension axes with respect to the intended detection axes.

FIG. 4 presents a second embodiment of a two-axis MEMS sensor with four differential sensor elements (A, B, C, D) each having an oblique suspension axis with respect to the intended detection axes. Again, the MEMS sensor is primarily designed for detecting acceleration (inclination) in x-axis and y-axis directions. The basic structure of the MEMS sensor is very similar to the one presented above, but certain differences can be identified. Sensing electrode pairs (A1, A2; B2, B2; C1, C2; D1, D2) have been rearranged so that the direction of changes in capacitances differ from the ones presented in the first embodiment. The structural arrangement of the sensor elements is now symmetric in view of a symmetry y-axis, but the sensing electrode pairs (A1, A2; B1, B2; C1, C2; D1, D2) are not mirrored with respect to two symmetry axes like in the first embodiment. Instead, sensor elements A and B appear to be similar, but the latter is rotated 90° clockwise. Similarly, sensor elements C and D appear similar, but the latter is rotated 90° counterclockwise. Also the direction of change of capacitance has been changed for sensor elements A and D by rearranging the mutual placement of stator (5a, 5b) and rotor fingers (4a, 4b). This rearrangement of order of the sensing electrode pairs (A1, A2; B1, B2; C1, C2) and changing of direction of change of capacitance in sensing electrode pairs (A1, A2; B1, B2) of sensor elements A and B to differ from those presented in FIGS. 1 and 2 changes the mutual relations of the detection signals received from the sensing electrode pairs (A1, A2, B1, B2, C1, C2, D1, D2). Nevertheless, each sensor element (A, B, C, D) is still a differential sensor element providing differential detection results from two sensing electrode pairs (A1, A2; B1, B2; C1, C2; D1, D2), and the detected changes in capacitances may be utilized in a computing unit for calculating the direction and magnitude of detected acceleration and/or inclination. The sensor device according to this second embodiment is also capable for double differential detection. The "cross coupled" arrangement as in FIG. 4 may provide further benefits, for instance it may have improved capability to compensate certain error sources in the sensor element, such as stray capacitances.

As an example, in case of an acceleration/inclination in positive x-axis direction causing the rotor elements (A, B, C, D) to move towards the negative x-axis, capacitance of sensing electrode pairs A2, B1, C2 and D1 would decrease due to moving the respective rotor fingers (4b) further away from the respective stator fingers (5b), and capacitance of sensing electrode pairs A1, B2, C1 and D2 would increase due to the respective rotor fingers (4a) moving away from the corresponding stator fingers (5a). As a second example, in case of an acceleration/inclination in positive y-axis direction causing the rotor elements (A, B, C, D) to move towards negative y-axis, capacitance of sensing electrode pairs A1, B1, C2 and D2 would increase due to the respective rotor fingers (4a) of each respective rotor structure (2) moving towards the corresponding stator fingers (5a) and capacitance of sensing electrode pairs A2, B2, C1 and D1 would decrease simultaneously.

A further difference may be detected in arrangement of the electrode fingers of each sensor element (A, B, C, D), especially in the stator electrode fingers (5a, 5b). In this embodiment, the spring (3) is not used as an additional rotor electrode finger, and therefore both stators (6a, 6b) have number of electrode fingers (5a, 5b) equal to the respective number of rotor electrode fingers (4a, 4b).

Although the layout of the MEMS sensor in FIG. 4 is not fully symmetrical in all directions, it should be understood that the centroid of the structure is located at the center of the common anchoring structure (1) similarly to the centroid of the structure presented in FIG. 1.

Figure 5:
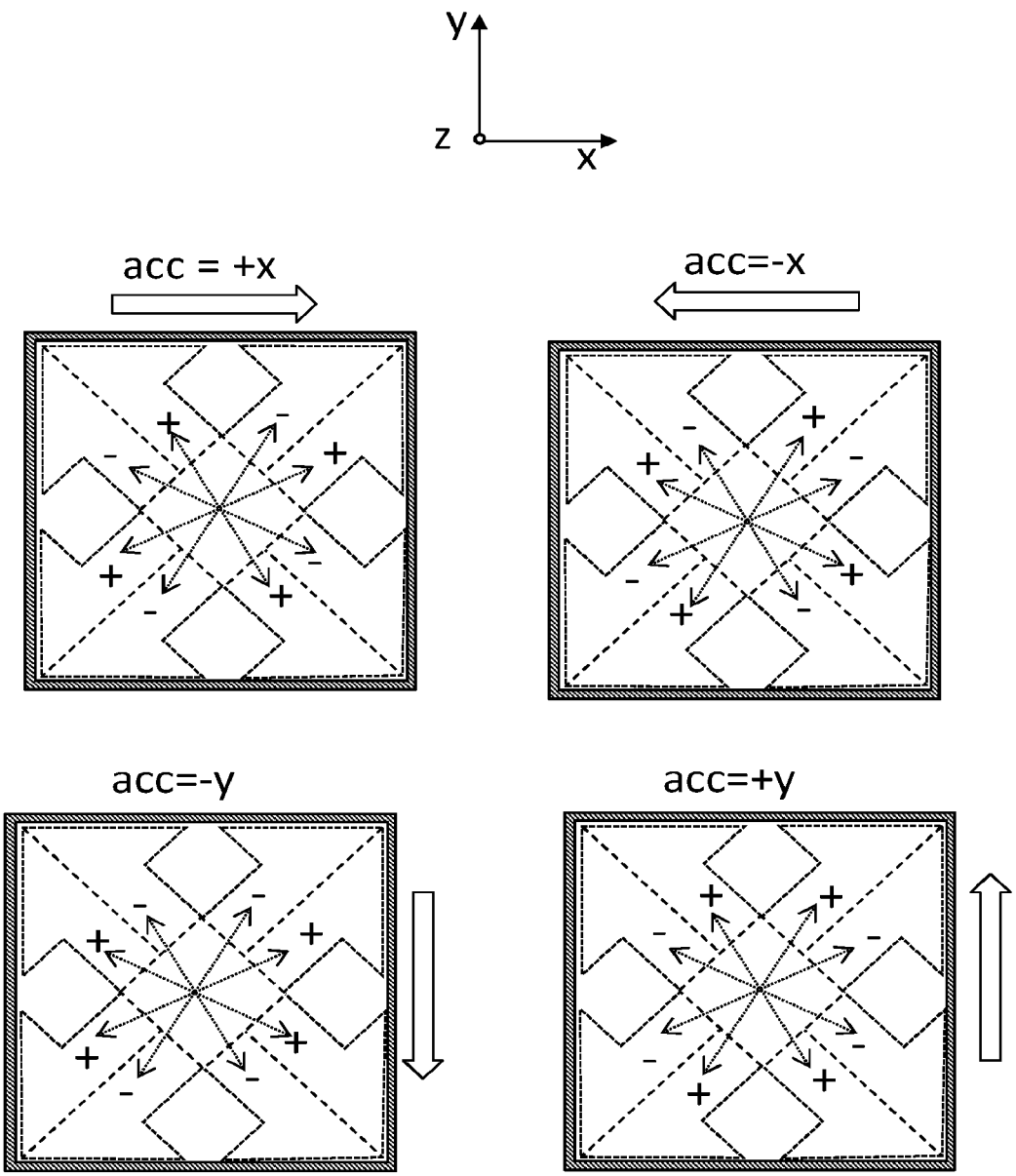
FIG. 5 illustrates electrical functional symmetry of the second embodiment of a two-axis MEMS sensor with four differential sensors.

It may be noticed that the sensing electrode pairs in the second embodiment have a symmetric pattern. Electrical functional symmetry of the second embodiment of a two-axis MEMS sensor is illustrated in FIG. 5. Outline of the MEMS sensor is illustrated without details. Four different situations are shown, each representing acceleration in different directions: positive and negative x-axis and positive and negative y-axis. Direction of detected change of capacitance is marked with "+" and "−"-signs: if capacitance increases, a plus (+) is marked, and if capacitance decreases a minus (−) sign is marked. It may be noticed that in this embodiment, the direction of detected change is always mirror symmetrical with respect to the geometrical center of the MEMS device. Dotted arrows crossing the geometrical center illustrate this symmetry. Each combination of directions of change among the four differential sensor elements are unique, and the sensor is capable of double differential detection.

Figure 6:
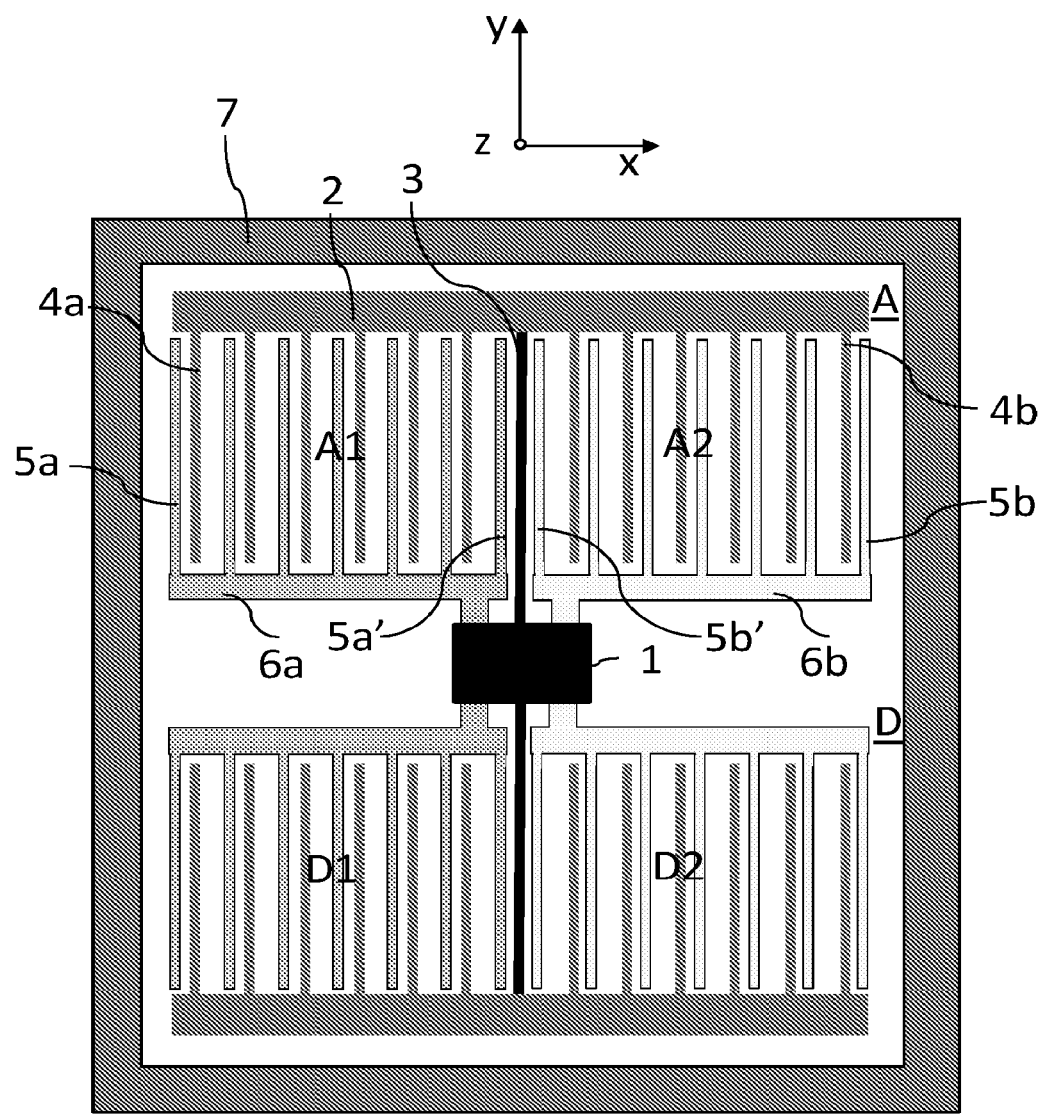
FIG. 6 illustrates a third embodiment of a MEMS sensor.

FIG. 6 presents a third embodiment of the invention, in form of a one-axis MEMS sensor. This sensor is capable of detecting acceleration/inclination along x-axis. Same principle of suspending the sensor elements in one common anchor structure (1) is used as in the earlier examples: the anchoring area (1) is common to all sensor element structures, but this area may comprise one or more anchor structures disposed at or near the geometrical center of the MEMS sensor, each anchor structure supporting one or more sensor element structures. This arrangement is more traditional if compared with the first two embodiments in the way that now the direction of suspending springs (3), in other words the suspension axis is now orthogonal with the detection axis (x-axis).

This MEMS sensor has same parts as the earlier embodiments, namely a common anchoring area (1) supporting two sensor elements (A, D). Each sensor element has a rotor structure (2) flexibly suspended to one or more anchor structures located within the common anchoring area (1) with a long spring (3), and two stator structures (6a, 6b) rigidly anchored to one or more anchor structures located within the common anchoring area (1). A number of rotor fingers (4a, 4b) form a capacitive sensing electrode pair (A1, A2; D1, D2) with the respective stator fingers (5a, 5b) coupled to the fixed stator structures (6a, 6b). A frame structure (7) surrounds the sensor elements. In this embodiment, additional stator electrode fingers (5a', 5b') are arranged next to the spring (3) in order to increase the total area of the sensing electrode pairs (A1, A2; D1, D2), thus enabling providing of a stronger detection signal.

When acceleration occurs in the x-axis direction, both sensor elements (A, D) provide a differential detection signal. Thus, even this simple, single axis design enables use of double differential detection with improved self-testing capability and improved error correction capability. When acceleration occurs in positive x-axis direction so that the rotor masses (2) move towards negative x-axis direction due to their inertia, capacitance detected from sensing electrode pairs A1 and D1 will increase, as the respective electrode comb pairs (5a, 4a; 5a', 4a) move closer to each other, whereas the capacitance detected from sensing electrode pairs A2 and D2 will decrease. It may be noticed that this example is symmetrical with respect to both the x-axis and the y-axis traversing through the geometrical center of the MEMS sensor. The common anchoring area (1) may comprise more than one multiple anchor structures disposed at or in close proximity of the centroid of the MEMS sensor. As for structure of the MEMS sensor, mirror image symmetry may be detected for both the x- and the y-axis direction symmetry axes. Both structural and electrical functional symmetry is a mirror symmetry in view of a symmetry axis that is orthogonal to the suspension axis, thus aligned with x-axis and traversing through geometrical center of the MEMS sensor. This type of symmetry allows adding an extra pair of electrode combs by utilizing the springs (3) as rotor electrode fingers, increasing the level of detection signal received from the electrode pairs.

Figure 7:
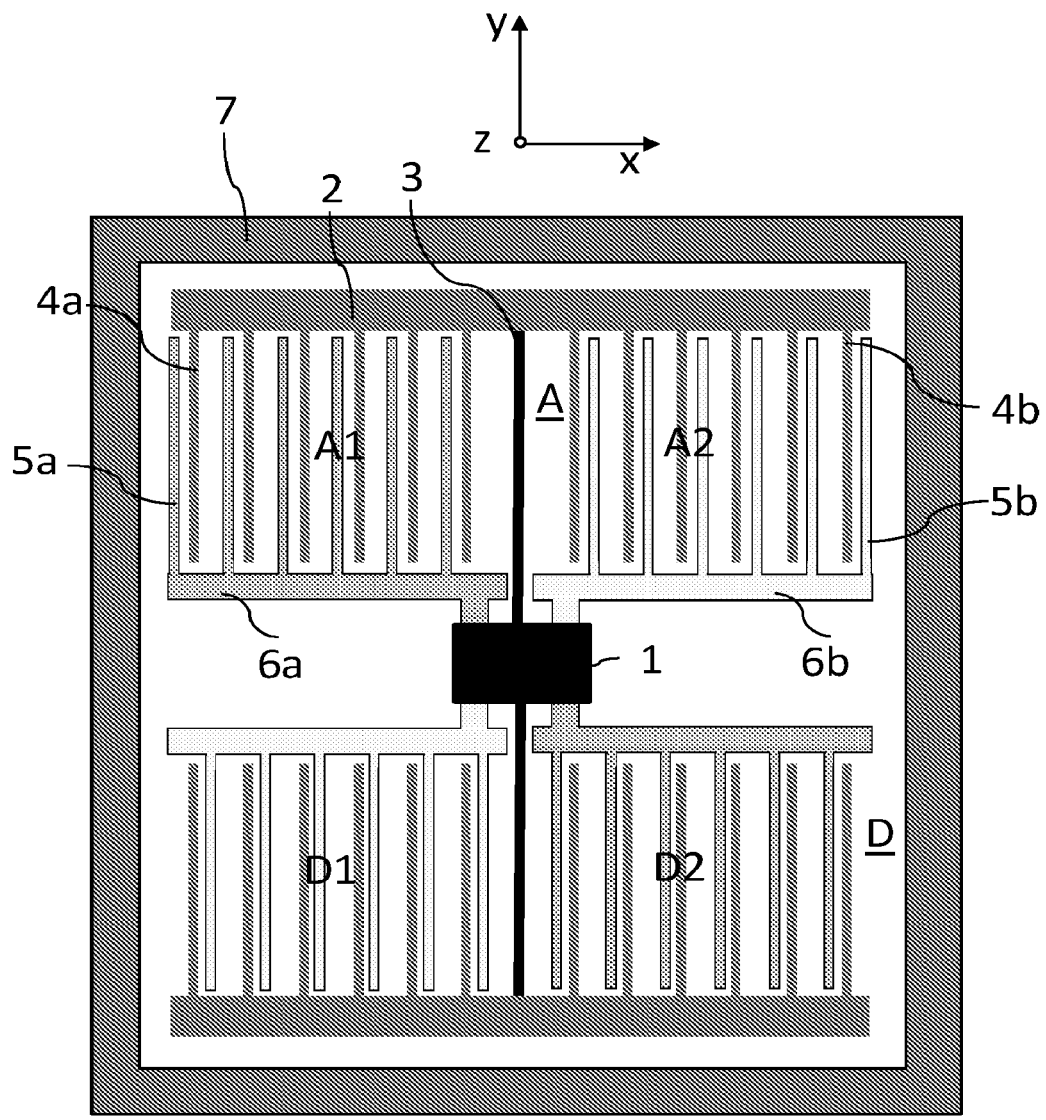
FIG. 7 illustrates a fourth embodiment of a MEMS sensor.

FIG. 7 illustrates a fourth exemplary embodiment, in form of a one-axis MEMS sensor. The arrangement is similar to what was presented in FIG. 4. Suspension axis of the rotor structures (A, D) is orthogonal to the detection axis. However, the mutual placement of the electrode fingers (4*a*, 4*b*, 5*a*, 5*b*) of sensing electrode pairs D1 and D2 has been rearranged, and additional stator electrode fingers for utilizing the springs (3) as rotor electrode fingers in the earlier embodiment have been omitted. This structure is geometrically symmetrical only with respect to a y-axis direction symmetry axis (suspension axis) traversing through the geometrical center of the MEMS sensor. In view of electrical functionality, sensor elements have been arranged so that capacitance of sensing electrode pairs A1 and D2 will change mutually in similar manner and capacitance of sensing electrode pairs A2 and D1 will change to the same direction. This arrangement may be considered symmetrical in view of the geometrical center of the MEMS sensor in the similar manner as the second embodiment. Arranging the sensing electrode pairs crosswise mirrored like this may be beneficial for compensating certain kind of stress caused by the package. For instance, stray capacitance induced by capping wafer deformation may be compensated more effectively with this structure than in the third embodiment.

Figure 8:
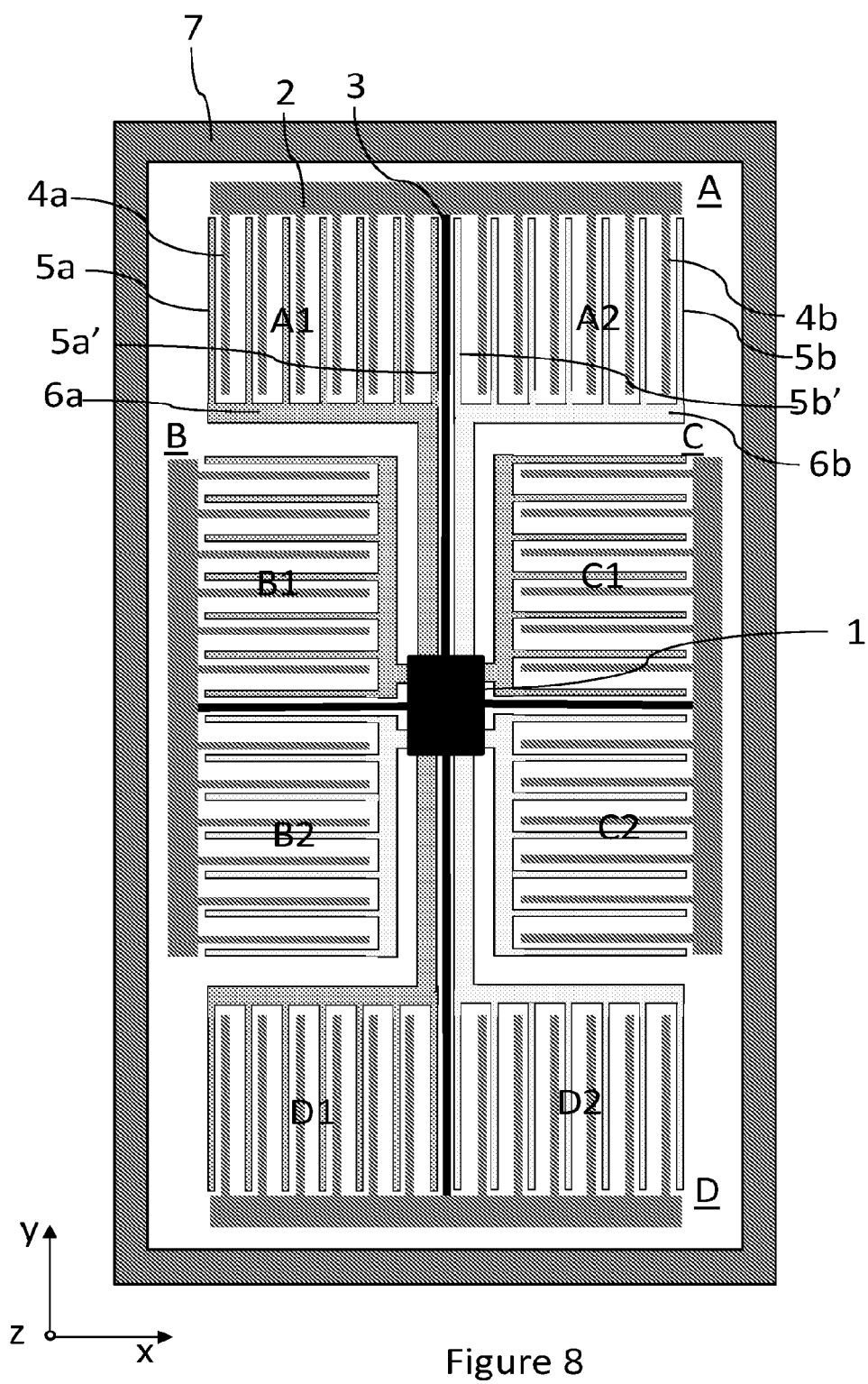
FIG. 8 illustrates a fifth embodiment of a MEMS sensor.
Figure 9:
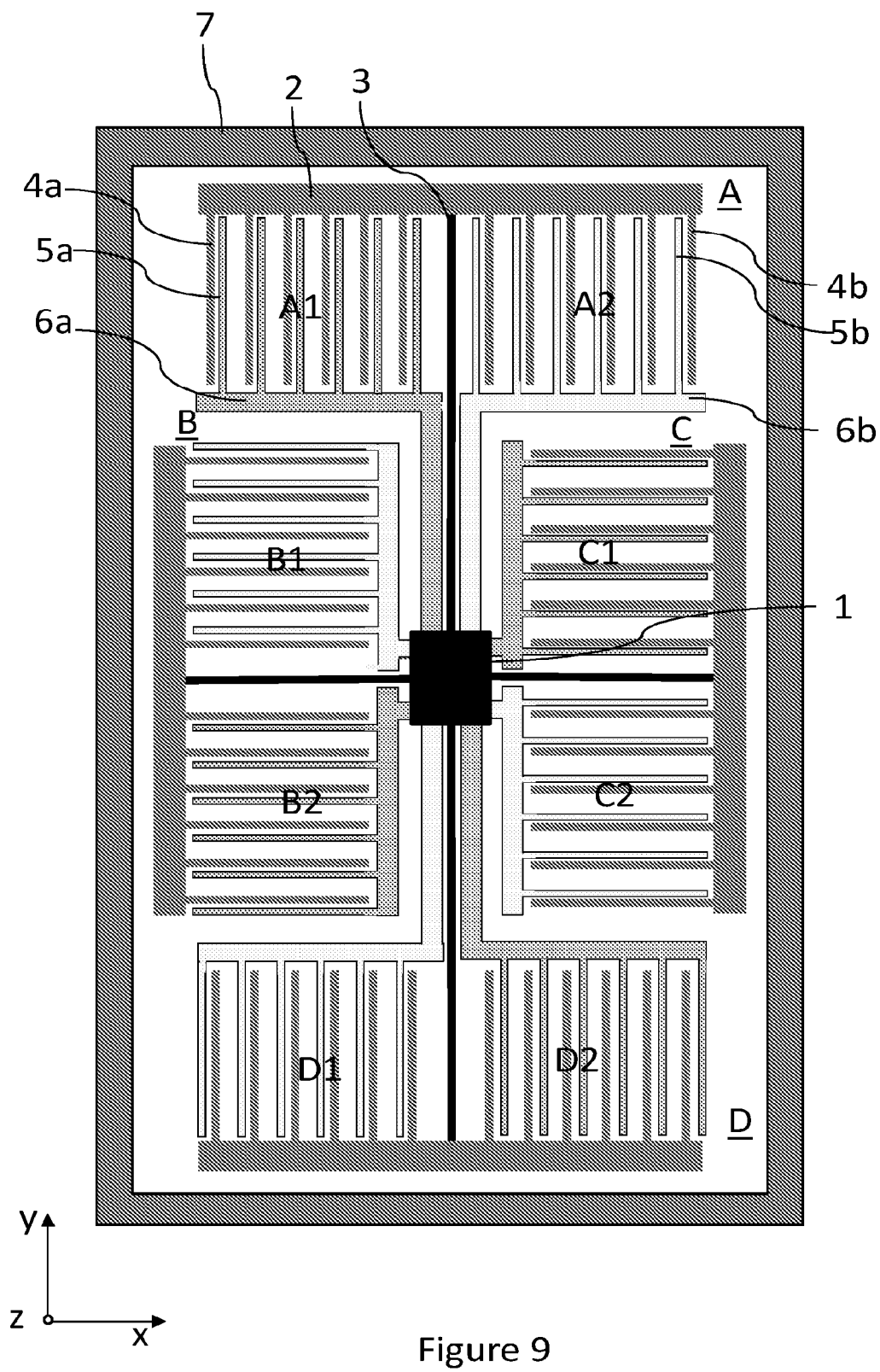
FIG. 9 illustrates a sixth embodiment of a MEMS sensor.

FIGS. 8 and 9 illustrate a fifth and a sixth embodiment in form of a two-axis MEMS sensor. Now the detection axes are x-axis and y-axis, and each pair of sensor elements arranged to detect either of these directions differentially are suspended orthogonally in view of the respective detection axes. Suspension axis of each sensor element (A, B, C, D) is orthogonal to the detection axis of the same sensor element (A, B, C, D). Sensor elements A and D are arranged to detect acceleration/inclination in x-axis direction and sensor elements B and D are arranged to detect acceleration/inclination in y-axis direction. As in all earlier embodiments, all four sensor elements are suspended by long springs (3) to a common anchoring area (1) arranged at or in the vicinity of the geometrical center of the entire MEMS sensor. Again, arranging single common anchor structure or more than one anchor structures may be arranged at the common anchoring area (1) in the vicinity or at the geometrical center of the MEMS sensor. Sensor elements A and D are arranged for detecting acceleration/inclination in x-axis direction and sensor elements B and C are arranged for detecting acceleration/inclination along y-axis direction. The device may also easily be rotated by 90° in order to switch the detection axes.

In the fifth embodiment presented in FIG. 8, the both the structural and the electrical functionality arrangement is symmetrical with view of symmetry axes that are orthogonal to the suspension axes of the respective sensor elements, which are aligned with the outer edges of the MEMS sensor. Additional stator electrode fingers (5', 6') are arranged to increase the level of detection signal, using the respective spring (3) as rotor electrode.

Capacitances of sensing electrode pairs A1 and D1 change in mutually same direction, as well as capacitances of sensing electrode pairs A2 and D2, but in opposite direction from the former, when detection occurs in direction of the x-axis. Capacitances of sensing electrode pairs B1 and C1 change in mutually same direction, and capacitances of sensing electrode pairs B2 and C2 likewise, but in the opposite direction from the former, when detection occurs in direction of the y-axis. Thus, arrangement of the sensing electrode pairs (A1, A2, B2, B2, C1, C2, D1, D2) is mirror symmetrical in view of the two symmetry axes aligned with the suspension axes that are orthogonal to the suspension axes of each pair of mirrored elements.

In the sixth embodiment presented in FIG. 9, the strict, full structural symmetry is broken in order to change the relative detection directions of different electrode combs. In this case, the electrical functionality symmetry of the detection directions of the sensing electrode pairs (A1, A2, B2, B2, C1, C2, D1, D2) is pairwise symmetrical with respect to the geometrical center of the MEMS sensor. In this sixth embodiment, use of springs as additional rotor electrode combs has been omitted, so that no additional stator electrode combs have been added for the purpose.

It is apparent to a person skilled in the art that as technology advanced, the basic idea of the invention can be implemented in various ways. The invention and its embodiments are therefore not restricted to the above examples, but they may vary within the scope of the claims.

The invention claimed is:

1. A MEMS sensor with movable and fixed components for measuring linear acceleration, said sensor comprising:
   at least two mutually independent differential sensor elements disposed inside a common frame structure, the frame structure providing walls for hermetic sealing of the MEMS sensor, wherein the at least two mutually independent differential sensor elements are pairwise configured to perform double differential detection of the linear acceleration; and
   a common anchoring area to which rotor masses and stator structures of the pairwise configured differential sensor elements are anchored, the common anchoring area being located at the centroid of the pairwise configured differential sensor elements.

2. A MEMS sensor according to claim 1, wherein each differential sensor element of the at least two pairwise configured mutually independent differential sensor elements includes:
   a movable rotor mass suspended with a spring to an anchor structure within the common anchoring area, the spring allowing the rotor mass to move within a plane of the device; and
   two immovable stator structures rigidly anchored to one or more anchor structures within the common anchoring area,
   wherein two sensing electrode pairs each formed by a defined number of rotor fingers of the rotor mass and a defined number of stator fingers of one of the two stator structures are configured to provide a differential detection signal.

3. The MEMS sensor according to claim 2, wherein the two immovable stator structures of each differential sensor element of the at least two pairwise configured mutually independent sensor elements are disposed symmetrically in the plane of the device on opposite sides of the spring suspending the movable rotor mass.

4. The MEMS sensor according to claim 2, wherein the rotor masses of differential sensor elements of the at least two pairwise configured mutually independent differential sensor elements are suspended to a common rotor anchor structure located at or in a vicinity of the centroid of the pairwise configured differential sensor elements within the common anchoring area.

5. The MEMS sensor according to claim 2, wherein rotor masses of the differential sensor elements of the pairwise configured mutually independent differential sensor elements are suspended to separate rotor anchor structures located at or in a vicinity of the centroid of the pairwise arranged differential sensor elements within the common anchoring area.

6. The MEMS sensor according to claim 2, wherein stator structures of the differential sensor elements of the pairwise configured mutually independent differential sensor elements are anchored to a common stator anchor structure located at or in a vicinity of the centroid of the pairwise configured differential sensor elements within the common anchoring area.

7. The MEMS sensor according to claim 2, wherein stator structures of the differential sensor elements of the pairwise configured mutually independent differential sensor elements are anchored to a number of stator anchor structures located in a vicinity of the centroid of the pairwise configured differential sensor elements within the common anchoring area.

8. The MEMS sensor according to claim 2, wherein the rotor mass of each of the differential sensor elements of the pairwise configured mutually independent differential sensor elements is suspended to an anchor structure within the common anchoring area with a rectilinear beam spring allowing the rotor mass to move within the plane of the device, but preventing the rotor mass from moving away from the plane of the device, the spring defining a suspension axis of the sensor element, the suspension axis traversing along the longitudinal dimension of the spring.

9. The MEMS sensor according to claim 2, wherein the spring suspending the rotor mass of the respective sensor element is configured as a rotor electrode finger for both sensing electrode pairs of the respective sensor element.

10. The MEMS sensor according to claim 1, comprising:
two pairs of differential sensor elements, each pair having a common suspension axis oblique to the detection axes of the sensor elements, wherein the suspension axes are mutually orthogonal,
wherein each of the differential sensor elements is configured to have two mutually orthogonal detection axes.

11. The MEMS sensor according to claim 10, wherein the suspension axis of each differential sensor element has a 45 degree angle with respect to both said detection axes.

12. The MEMS sensor according to claim 1, comprising:
two pairs of differential sensor elements, each pair having a common suspension axis orthogonal to a detection axis of both sensor elements in the respective pair of sensor elements, the suspension axes being mutually orthogonal, wherein
each of the differential sensor elements is configured to have a single detection axis.

13. The MEMS sensor according to claim 1, comprising:
one pair of differential sensor elements having a common suspension axis orthogonal to a detection axis of the pair of sensor elements, wherein
each of the differential sensor elements is configured to have a single detection axis.

14. The MEMS sensor according to claim 2, wherein the sensing electrode pairs of the differential sensor elements of the pairwise configured mutually independent differential sensor elements are arranged in mirrored positions with respect to a symmetry axis orthogonal to a common suspension axis of the respective sensor element pair, and wherein each of such mirror symmetrical sensor element pairs produce a capacitive detection value that changes in a mutually same direction.

15. The MEMS sensor according to claim 2, wherein the sensing electrode pairs of the differential sensor elements of the pairwise configured mutually independent differential sensor elements are configured pairwise symmetrically on opposite sides of the geometrical center of the pairwise configured mutually independent differential sensor elements, and wherein each of such sensing electrode pairs on opposite sides of the geometrical center provide a capacitive detection value that changes in mutually same direction.

16. The MEMS sensor according to claim 1, wherein detection values of the differential sensor elements of the pairwise configured mutually independent differential sensor elements may be used for performing a self-test, wherein the self-test includes summing the detection values of all differential sensor elements in a calculation unit, and wherein the self-test indicates that the sensor is working correctly if the total sum of the self-test detection values equals zero.

17. The MEMS sensor according to claim 1, wherein any lateral dimension of the common anchoring area in a plane of the device does not exceed 20% of the total lateral dimension of the MEMS sensor in the same direction.

18. The MEMS sensor according to claim 1, wherein any lateral dimension of the common anchoring area in a plane of the device does not exceed 20% of the total lateral dimension of the pairwise configured mutually independent differential sensor elements in the same direction.

* * * * *